United States Patent
Tsou et al.

(10) Patent No.: US 7,427,777 B2
(45) Date of Patent: Sep. 23, 2008

(54) THIN FILM TRANSISTOR, PIXEL STRUCTURE AND REPAIRING METHOD THEREOF

(75) Inventors: Yuan-Hsin Tsou, Kaohsiung (TW); Chien-Kuo He, Taipei County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 14 days.

(21) Appl. No.: 11/164,856

(22) Filed: Dec. 8, 2005

(65) Prior Publication Data

US 2007/0090357 A1   Apr. 26, 2007

(30) Foreign Application Priority Data

Oct. 24, 2005   (TW) .................. 94137106 A

(51) Int. Cl.
*H01L 27/14* (2006.01)
(52) U.S. Cl. .................. 257/59; 257/72; 257/E27.132; 349/46; 349/139
(58) Field of Classification Search ............... 438/149; 349/149, 43, 46, 139; 257/59, 72, E27.132, 257/E29.117, E29.151
See application file for complete search history.

(56) References Cited

U.S. PATENT DOCUMENTS

| | | |
|---|---|---|
| 5,741,716 A | 4/1998 | Choi et al. |
| 5,808,317 A | 9/1998 | Kuo |
| 6,310,668 B1 | 10/2001 | Ukita |
| 6,320,221 B1 | 11/2001 | Choi et al. |
| 6,664,569 B2 * | 12/2003 | Moon ..................... 257/72 |
| 6,930,743 B2 * | 8/2005 | Park et al. ................ 349/149 |
| 7,060,540 B2 * | 6/2006 | Hung ..................... 438/149 |
| 2001/0050368 A1 | 12/2001 | Moon |
| 2004/0080681 A1 | 4/2004 | Moon |
| 2004/0135164 A1 | 7/2004 | Park et al. |

FOREIGN PATENT DOCUMENTS

CN   1581513   2/2005

* cited by examiner

*Primary Examiner*—Minh-Loan T Tran
(74) *Attorney, Agent, or Firm*—Jianq Chyun IP Office

(57) ABSTRACT

A pixel structure including a scan line, a gate pattern, a first dielectric layer, a channel layer, a source, a drain, a data line, a second dielectric layer and a pixel electrode is provided. The gate pattern is electrically connected with the scan line and has an opening therein. The first dielectric layer covers the scan line and the gate pattern and it fills up the opening. Besides, the channel layer is disposed on the first dielectric layer, and the source and the drain are disposed on the channel layer. The drain is disposed above the opening of the gate pattern. The source is electrically connected with the data line, and the pixel electrode is electrically connected with the drain. The overlapping area between the gate pattern that has an opening and the drain can be kept so that the gate-drain capacitor (Cgd) is not changed.

3 Claims, 4 Drawing Sheets

THIN FILM TRANSISTOR, PIXEL STRUCTURE AND REPAIRING METHOD THEREOF

CROSS-REFERENCE TO RELATED APPLICATION

This application claims the priority benefit of Taiwan application Ser. No. 94137106, filed on Oct. 24, 2005. All disclosure of the Taiwan application is incorporated herein by reference.

BACKGROUND OF THE INVENTION

1. Field of Invention

The present invention relates to a pixel structure. In particularly, the present invention relates to a method for repairing the pixel structure and a thin film transistor structure in the pixel structure.

2. Description of Related Art

The media technology in modern societies is rather prosperous, mostly benefiting from rapidly advancing of the semiconductor devices and display apparatuses. Owning extraordinary features such as high resolution, splendid space utility, low power consumption, free of radiation and so forth, the thin film transistor liquid crystal display (TFT-LCD) has gradually become dominant as the mainstream in the display marketplace nowadays.

In general, the TFT-LCD is mainly composed of a thin film transistor (TFT) array substrate, a pair of facing substrates, and a liquid crystal (LC) layer disposed between these two substrates. Here, the TFT array substrate mainly comprises a substrate, a plurality of TFTs arranged in matrix on the substrate, pixel electrodes, scan lines and data lines. Generally speaking, the scan lines and data lines are used to transfer the signals to the corresponding pixel structure for displaying images.

FIG. 1 schematically shows a local view of a traditional pixel structure in the prior art, and FIG. 2 schematically shows a cross-section view with reference to the section line A-A' in FIG. 1. Please refer to FIGS. 1 and 2 simultaneously. The traditional pixel structure 120 mainly comprises a TFT 122, a pixel electrode 124, a scan line 126 and a data line 128. The TFT 122 is electrically connected to the pixel electrode 124. Specifically, the TFT 122 on the substrate 110 mainly comprises a gate 122a, a channel layer 122b, a source 122c and a drain 122d, as shown in FIG. 2. The structure of this TFT 122 is belonged to the bottom gate type, and the drain 122d of the TFT 122 is electrically connected to the pixel electrode 124. As can be seen in FIG. 1, the scan line 126 and data line 128 can be used for transferring a proper voltage via the TFT 122 to the pixel electrode 124 such that the displaying of images is achieved.

It's worthy to note that the effect of gate-to-drain parasitic capacitor (Cgd) is usually induced on the overlapping area 10 of the gate 122a and drain 122d. This value of gate-to-drain parasitic capacitor Cgd is directly proportional to the area of the overlapping area 10. In manufacturing TFTs, due to alignment-error of photo-masks, vibration of the machinery or other factors, the changing of the overlapping area 10 of the gate 122a and drain 122d would occur, and it causes the variation of the value of gate-to-drain parasitic capacitor. Nevertheless, the pixel feed through voltage tends to vary responding to this variance of the value Cgd, and the displaying quality of the TFT-LCD suffers from the variance of the pixel feed through voltage.

Furthermore, due to the errors during the fabricating process that would sometimes cause defects in part of the pixel structure, an act of repairing the pixel structure with defects is performed. Take one for example. Mostly, when TFT-LCD is under the normally white mode, the method of repairing the pixel structure 120 is to electrically connect the drain 122d and the scan line 126 so that the scan line 126 can be electrically connected to the pixel electrode 124 via the drain 122d. By doing so, dot defects of the pixel structure 120 can be repaired as dark points. For the real cases, however, as result of the over-twisting of liquid crystal polymers inside TFT panel, caused by the over large voltage difference across the scan line 124 (the pixel electrode 124) and the electrode on the facing substrate, the pixels with defects appear grey points and they are unable to be repaired as dark points.

SUMMARY OF THE INVENTION

In view of this, one object of the present invention is to provide a pixel structure with a stable quality.

Another object of the present invention is to provide a repairing method capable of repairing the pixel structure of the present invention for increasing the yield of products.

One another object of the present invention is to provide a thin film transistor capable of keeping a constant value of gate-to-drain parasitic capacitor.

The present invention provides a pixel structure comprising a scan line, a gate pattern, a first dielectric layer, a channel layer, a source, a drain, a data line, a second dielectric layer and a pixel electrode. Wherein, the gate pattern is electrically connected with the scan line and an opening is formed inside the gate pattern. The first dielectric layer covers the scan line and the gate pattern and it fills up the opening. In addition, the channel layer is disposed on the first dielectric layer above the gate pattern, and the source and the drain are disposed on the channel layer. Also the drain is disposed above the opening. Furthermore, the data line is disposed on the first dielectric layer and the source is electrically connected with the source. The second dielectric layer covers the source, the drain and the data line. Besides, the pixel electrode is disposed on the second dielectric layer and the pixel electrode is electrically connected with the drain.

In one preferred embodiment of the present invention, the pixel structure mentioned above further comprises an extension line that extends above the gate pattern.

In one preferred embodiment of the present invention, the pixel structure mentioned above further comprises an ohm-contact layer disposed between the channel layer and the source and the drain.

In one preferred embodiment of the present invention, wherein a material of the channel layer can be amorphous silicon for example.

In one preferred embodiment of the present invention, wherein a material of the first dielectric layer, for example, can be silicon nitride, silicon oxide, or silicon oxynitride (SiON).

In one preferred embodiment of the present invention, wherein a material of the second dielectric layer, for example, can be silicon nitride, silicon oxide, or silicon oxynitride (SiON).

In one preferred embodiment of the present invention, wherein a material of the pixel electrode can be indium tin oxide (ITO) for example.

The present invention provides a pixel repairing method suitable for repairing the pixel structure mentioned above, comprising steps of: cutting off the gate pattern that is around the opening and on two sides of the drain and the extension line to form a floating pattern below the drain and the extension line; electrically connecting the extension line and the floating pattern; and electrically connecting the drain and the floating pattern.

The mentioned-above pixel repairing method in one preferred embodiment of the present invention, a method of cutting off the gate pattern which is around the opening and on two sides of the drain and the extension line is laser grooving technique.

The mentioned-above pixel repairing method in one preferred embodiment of the present invention, a method of electrically connecting the extension line and the floating pattern and of electrically connecting the drain and the floating pattern electrically is laser welding technique.

The present invention provides a thin film transistor comprising a gate pattern, a first dielectric layer, a channel layer, a source, a drain and a second dielectric layer. Wherein, an opening is formed inside the gate pattern, and the first dielectric layer covers the gate pattern and fills up the opening. In addition, the channel layer is disposed on the first dielectric layer above the gate pattern, and the source and the drain are both disposed on the channel layer. The drain mentioned above is disposed above the opening, and the second dielectric layer covers the source and the drain.

The mentioned-above thin film transistor in one preferred embodiment of the present invention, a material of the channel layer can be amorphous silicon.

The mentioned-above thin film transistor in one preferred embodiment of the present invention, a material of the first dielectric layer can be silicon nitride, silicon oxide, or silicon oxynitride (SiON).

The mentioned-above thin film transistor in one preferred embodiment of the present invention, a material of the second dielectric layer can be silicon nitride, silicon oxide, or silicon oxynitride (SiON).

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
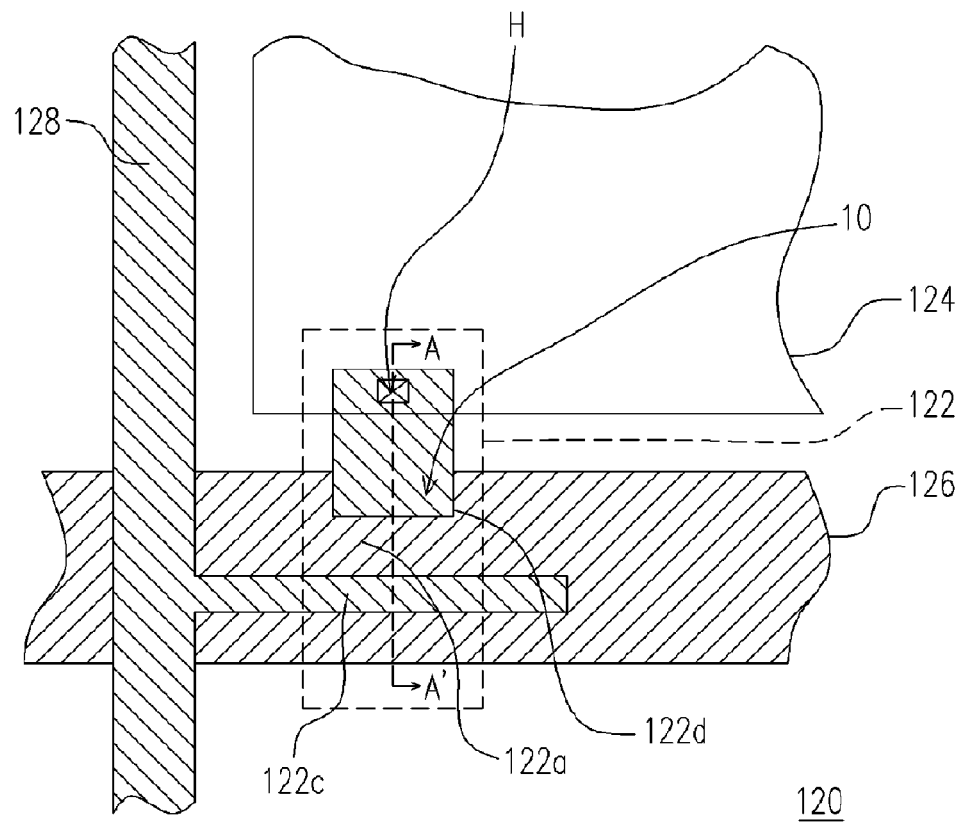
FIG. 1 schematically shows a local view of a traditional pixel structure in the prior art.
Figure 2:
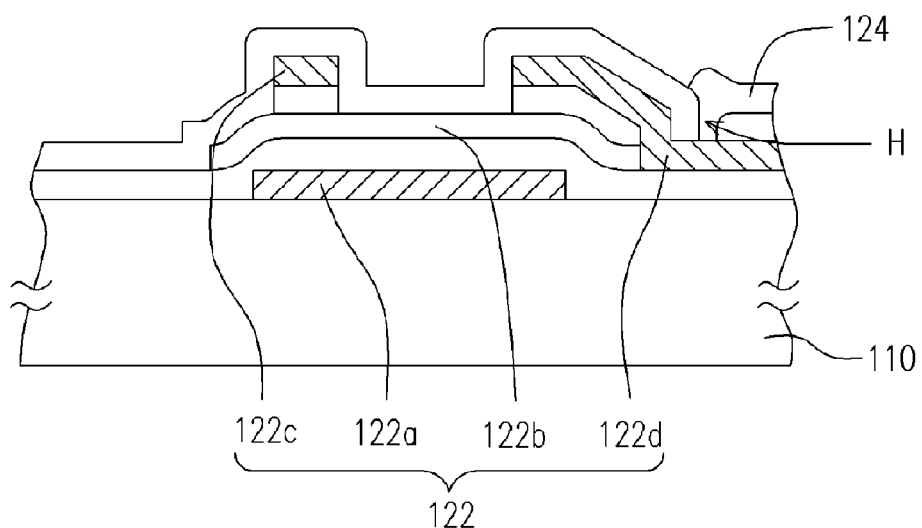
FIG. 2 schematically shows a cross-section view with reference to the section line A-A' in FIG. 1.
Figure 3:
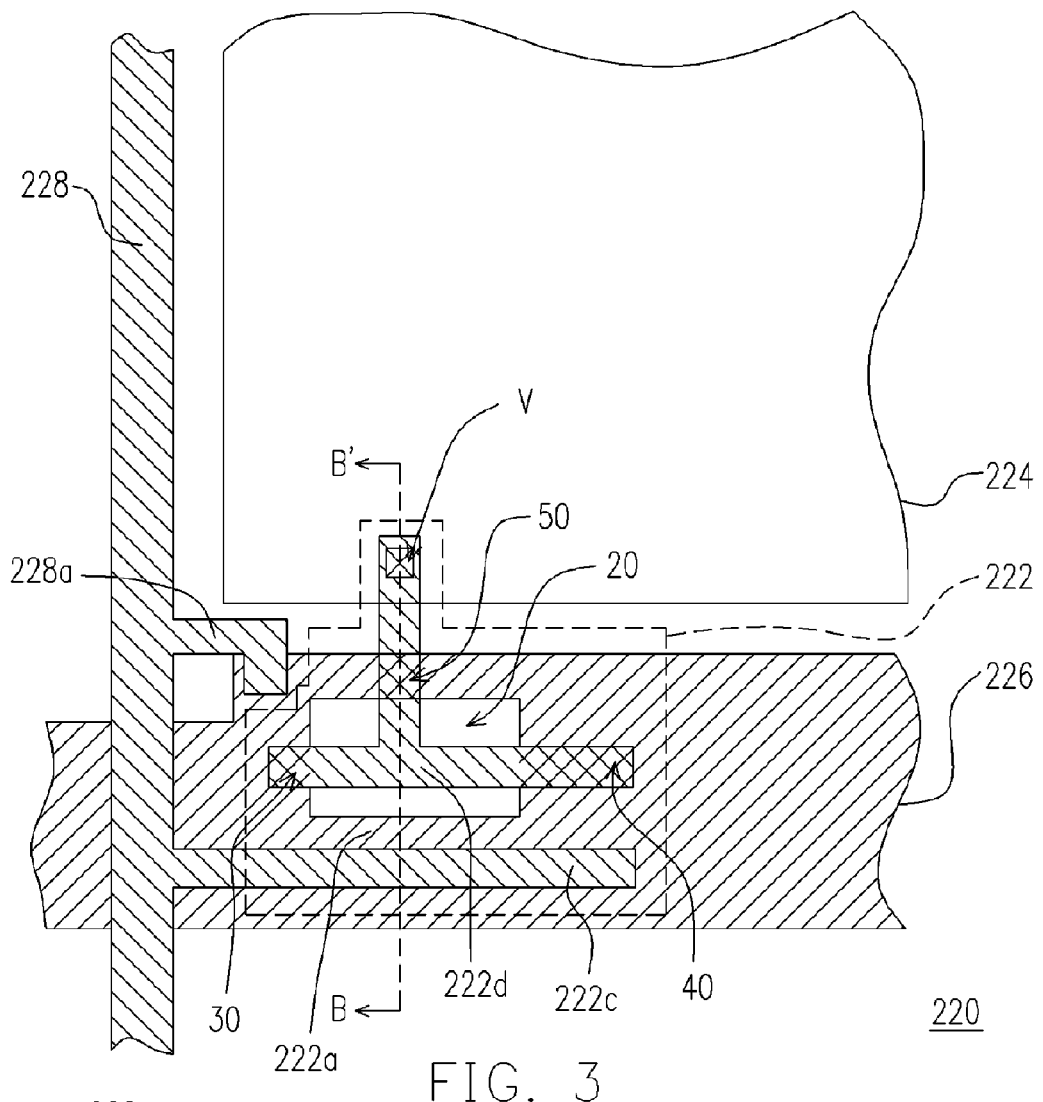
FIG. 3 schematically shows a local view of a pixel structure according to one preferred embodiment of the present invention.
Figure 4:
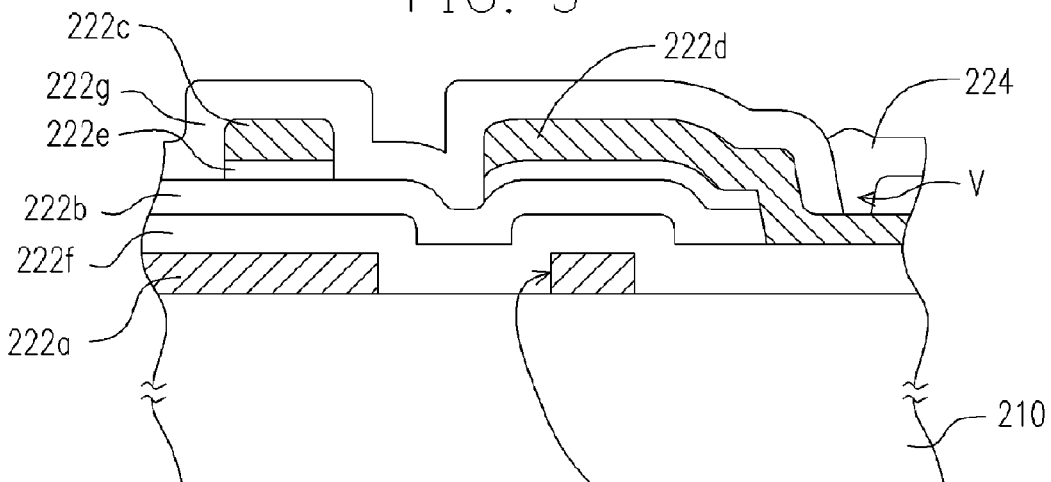
FIG. 4 schematically shows a cross-section view with reference to the section line B-B' in FIG. 3.

FIG. 3 schematically shows a local view of a pixel structure according to one preferred embodiment of the present invention, and FIG. 4 schematically shows a cross-section view with reference to the section line B-B' in FIG. 3. Please refer to FIGS. 3 and 4 simultaneously. The pixel structure 220 of the present invention mainly comprises a thin film transistor (TFT) 222, a pixel electrode 224, a scan line 226 and a data line 228.

In more detail, the TFT 222 on the substrate 210 is electrically connected to the pixel electrode 224, as shown in FIG. 4. This TFT 222 includes a gate pattern 222a, a channel layer 222b, a source 222c, a drain 222d, a first dielectric layer 222f and a second dielectric layer 222g. Here, the gate pattern 222a is electrically connected with the scan line 226 and it has an opening 20. The gate pattern 222a mentioned above, for example, is fabricated together with the formation of the scan line 226, and the opening 20 is formed in the meantime.

Besides, a material of the first dielectric layer 222f can be the electrically insulating materials such as Silicon Nitride, Silicon Oxide, or Silicon Oxynitride (SiON), for example. The first dielectric layer 222f covers the scan line 226 and gate pattern 222a and it fills up the opening 20. A material of the channel layer 222b mentioned above can be Amorphous-Silicon and it is disposed on the first dielectric layer 222f above the gate pattern 222a. To reduce the impedance of the channel layer 222b, an ohm-contact layer 222e is further formed between the channel layer 222b and the source 222c with drain 222d.

In other words, the source 222c and drain 222d are disposed on the ohm-contact layer 222e and the drain 222d is disposed above the opening 20. That is, the drain 222d is disposed on the first dielectric layer 222f above the opening 20. Here, the drain 222d can be T-shaped for example and the effect of gate-to-drain parasitic capacitor occurs in the overlapping area (areas 30, 40 and 50) of the gate pattern 222a and the drain 222d.

Furthermore, as discussed above the drain 222d is disposed across the opening 20. Accordingly, though aligned location of the T-shaped drain 222d somewhat deviates horizontally or vertically, due to the alignment-error of photo-masks and vibration of machinery during the fabricating process of the drain 222d, sum of the areas for overlapping areas 30, 40 and 50 remains unvaried. In other words, the value of gate-to-drain parasitic capacitor Cgd keeps a constant, allowing the feed-through voltage to be stable and the image quality of TFT-LCD to be maintained.

It's worthy to notice that, though the example with a rectangular opening 20 and the T-shaped drain 220d are taken in the present embodiment and shown in the related figures, the shape of the opening 20 and the drain 222d are not limited by the present invention. That is, both the opening 20 and the drain 222d can be formed in other shapes. For example, the opening can be circular or polygonal regular and so on, and the drain can be rectangular or other shapes.

In addition, the previously-mentioned data line 228 is disposed on the first dielectric layer 222f and electrically connected with the source 222c. In another embodiment, the data line 228 further comprises an extension line 228a electrically connected with the data line 228. The source 222c, data line 228 and extension line 228a mentioned above may be formed together. Wherein, the extension line 228a extends above the gate pattern 222a, and usage of the extension line 228a aims at assisting the laser repairing, as will be described in detail later.

Moreover, a material of the second dielectric layer 222g can be Silicon Nitride, Silicon Oxide, or Silicon Oxynitride (SiON), for example. And the second dielectric layer 222g covers the source 222c, drain 222d and data line 228. The pixel electrode 224 of the present embodiment is disposed on the second dielectric layer 222g and it is electrically connected to the drain 222d via a contact-window V.

Figure 5A:
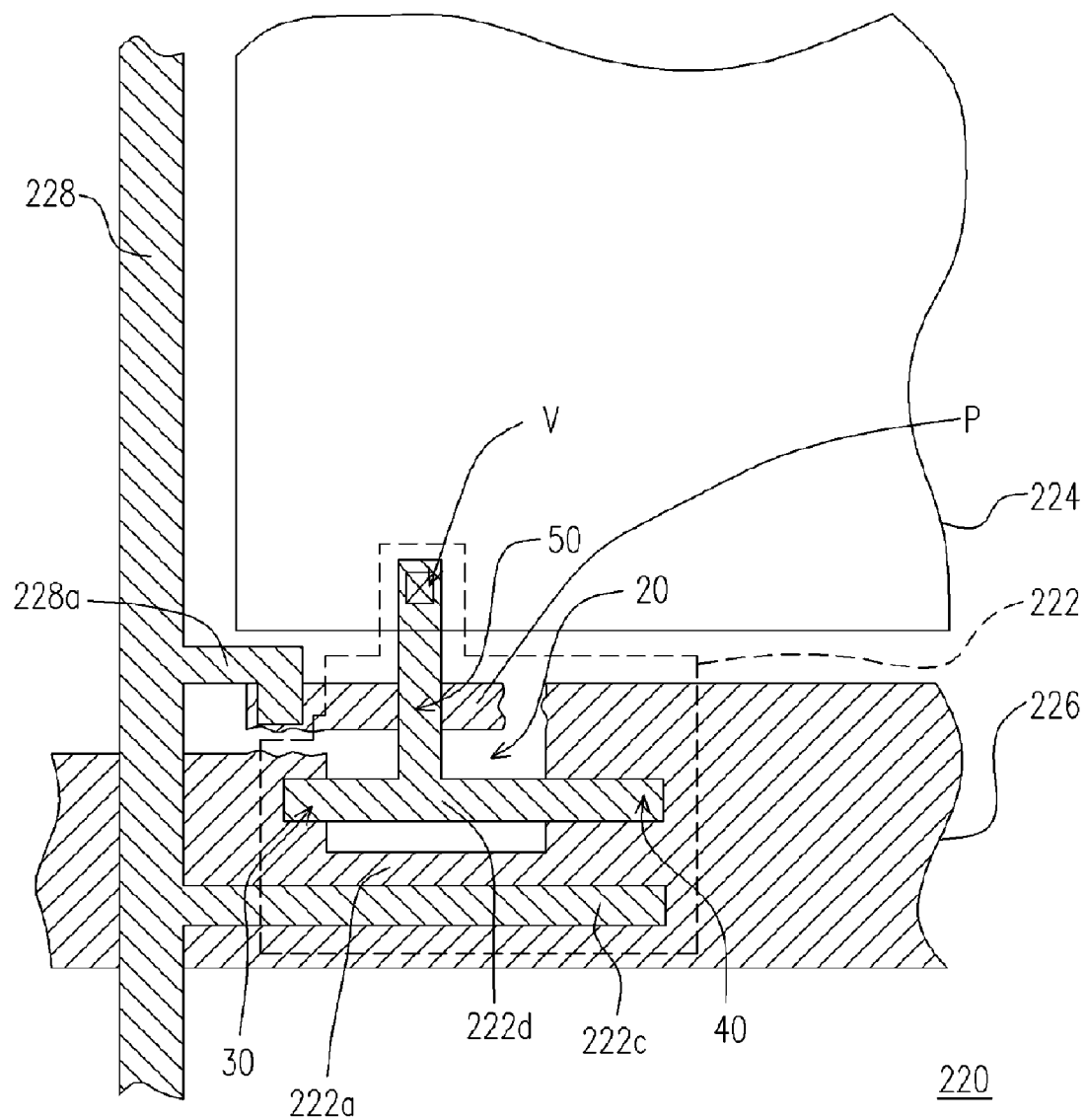
FIGS. 5A and 5B are flowcharts, schematically illustrating the repairing of a pixel structure according one preferred embodiment of the present invention.

Provided that the factors, such as fabricating processes or electrostatic damage, cause the defects in the pixel structure in FIG. 3, the method of repairing the pixel structure 220 in FIG. 3 is as follows. First, with reference to FIG. 3, the gate pattern 222a that is around the opening 20 and on either sides of the drain 222d and extension line 228a is cut off so that one part of the gate pattern 222a is formed as a floating pattern P below the drain 222d and extension line 228a, as shown in FIG. 5A. A method of cutting off the gate pattern 222a mentioned above may be the laser grooving technique. This floating pattern P has been electrically insulated from the gate pattern 222a.

Figure 5B:
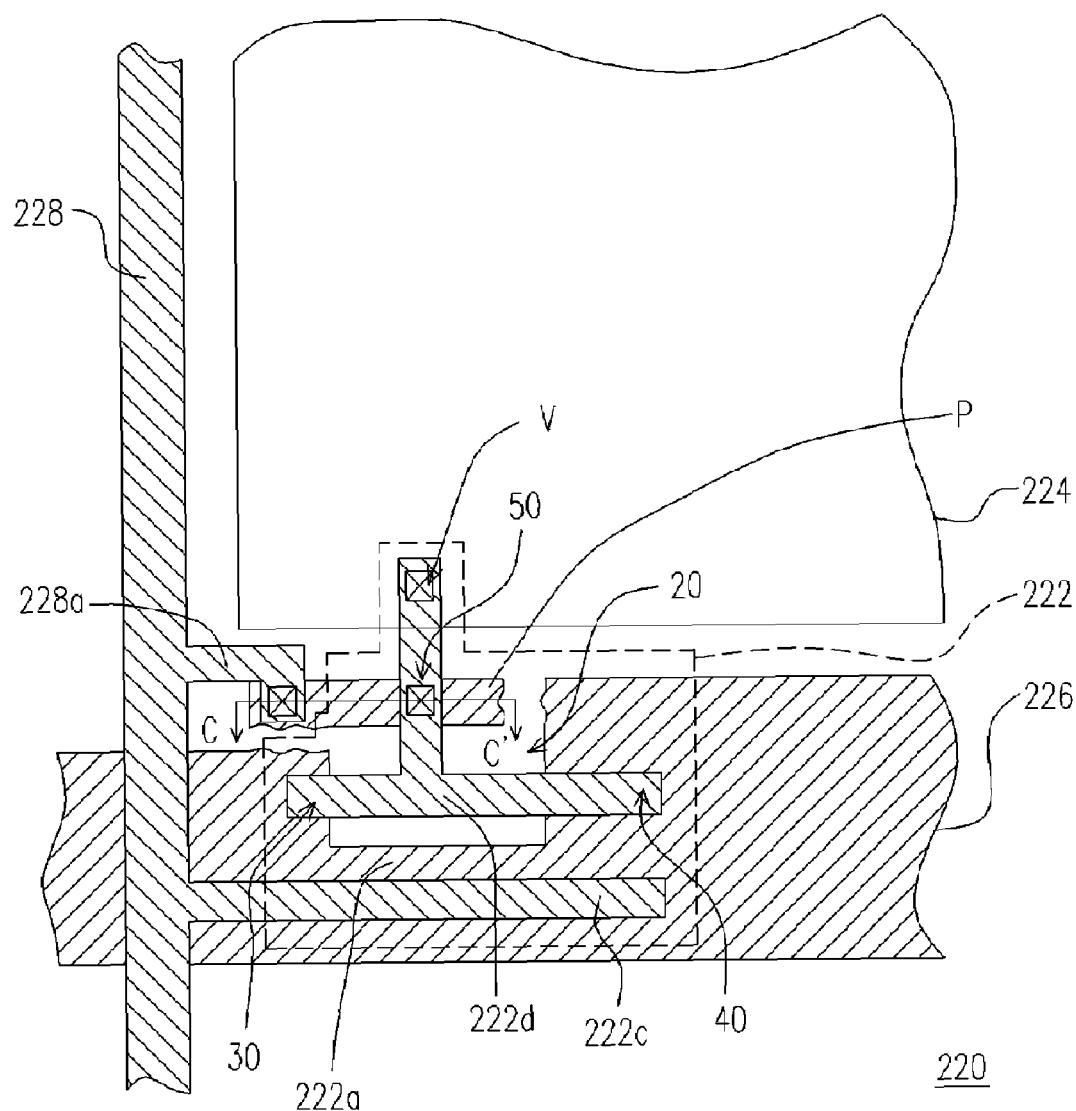
Figure 6:
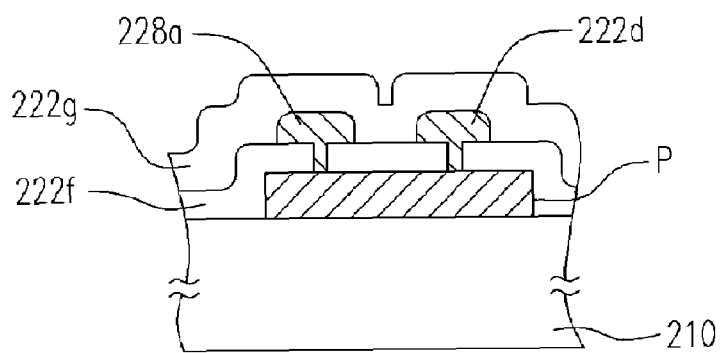
FIG. 6 schematically shows a cross-section view with reference to the section line C-C' in FIG. 5.

Next, as shown in FIG. 5B, the extension line 228a and floating pattern P are electrically connected and the drain 222d and floating pattern P are electrically connected. A method for performing electrical connection mentioned above is the laser welding technique. By doing so, the scan line 228 can be electrically connected to the drain 222d via the extension line 228a and the floating pattern P. Referring to FIG. 6 later, it schematically shows a cross-section view with reference to the section line C-C' in FIG. 5. By electrically connecting the extension line 228a to the floating pattern P, the pixel electrode 224 is electrically connected to the data line 228.

Usually, due to the voltage difference across the electrode on the facing substrate and the scan line 228 is smaller than that across the electrode on the facing substrate and the scan line 226. Thus, compared to the traditional repairing method that is to electrically connect the pixel electrode and scan line, repairing the pixels by using the laser welding technique to electrically connect the pixel electrode 224 and the data line 228 is capable of preventing the voltage difference across the pixel electrode 224 and electrode on the facing substrate form being too large. In this way, the over-twisting of liquid crystal molecules of the pixels can be avoided. Consequently, after repairing the pixel structure with dot defects for the TFT-LCD under normally white mode, a dark point can be formed in the displaying area correspondingly and repairing of the pixel structure is thus achieved.

To sum up, the pixel structure of the present invention and the repairing method thereof owns at least the advantages as follows.

(i) Due to adoption of the TFT whose gate pattern has an opening on which the drain is disposed in the pixel structure of the present invention, the gate-to-drain parasitic capacitor maintains constant.

(ii) By utilizing the repairing method of the pixel structure based on the present invention, the pixels with dot defects can be repaired as dark points.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A pixel repairing method suitable for repairing a pixel structure comprising a scan line; a gate pattern electrically connecting with the scan line, wherein an opening is formed inside the gate pattern; a first dielectric layer covering the scan line and the gate pattern and filling up the opening; a channel layer disposed on the first dielectric layer above the gate pattern; a source and a drain disposed on the channel layer wherein the drain is disposed above the opening; a data line disposed on the first dielectric layer and electrically connected with the source; a second dielectric layer covering the source, the drain and the data line; a pixel electrode disposed on the second dielectric layer and electrically connected with the drain; and an extension line electrically connecting with the data line and extending above the gate pattern, the pixel repairing method comprising:

cutting off the gate pattern which is around the opening and on two sides of the drain and the extension line for forming a floating pattern below the drain and the extension line;

electrically connecting the extension line and the floating pattern; and electrically connecting the drain and the floating pattern.

2. The pixel repairing method according to claim 1, wherein a method of cutting off the gate pattern being around the opening and on two sides of the drain and the extension line is laser grooving technique.

3. The pixel repairing method according to claim 1, wherein a method of connecting the extension line and the floating pattern electrically and connecting the drain and the floating pattern electrically is laser welding technique.

* * * * *